(12) United States Patent
Oyama et al.

(10) Patent No.: US 8,835,770 B2
(45) Date of Patent: Sep. 16, 2014

(54) ELECTRONIC COMPONENT AND METHOD FOR MANUFACTURING THE SAME

(71) Applicant: Murata Manufacturing Co., Ltd., Nagaokakyo (JP)

(72) Inventors: Junji Oyama, Kyoto-Fu (JP); Takamasa Kuboki, Nagaokakyo (JP); Yasuharu Matsui, Kyoto-Fu (JP); Muneyuki Daidai, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 220 days.

(21) Appl. No.: 13/632,376

(22) Filed: Oct. 1, 2012

(65) Prior Publication Data

US 2013/0025931 A1 Jan. 31, 2013

Related U.S. Application Data

(63) Continuation of application No. PCT/JP2011/055791, filed on Mar. 11, 2011.

(30) Foreign Application Priority Data

Apr. 1, 2010 (JP) ................................. 2010-085167

(51) Int. Cl.
*H05K 1/03* (2006.01)
*H05K 1/09* (2006.01)
(Continued)

(52) U.S. Cl.
CPC .......... *H01L 23/3107* (2013.01); *H01L 23/295* (2013.01); *H03H 9/1035* (2013.01); *H01L 2924/0002* (2013.01); *H01L 21/56* (2013.01)
USPC ........... 174/256; 174/255; 174/257; 174/259; 174/564; 156/60

(58) Field of Classification Search
USPC ...................... 174/255–257, 259, 564; 156/60
See application file for complete search history.

(56) References Cited

U.S. PATENT DOCUMENTS 5,504,993 A * 4/1996 Szerlip et al. .................... 29/849
6,380,622 B1 * 4/2002 Hirai et al. ...................... 257/712
(Continued)

FOREIGN PATENT DOCUMENTS

JP 09-227849 A 9/1997
(Continued)

OTHER PUBLICATIONS

Machine Translation of JP 2004-335872 A: Tokuhira et al.; Thermal Conductive Material Used for Cooling Heat Emitting Components; Filiing Date: May 9, 2003; Publication Date: Nov. 25, 2004.*

(Continued)

*Primary Examiner* — Timothy Thompson
*Assistant Examiner* — Sherman Ng
(74) *Attorney, Agent, or Firm* — Dickstein Shapiro LLP

(57) ABSTRACT

An electronic component that includes an electronic component body, sealing members sealing the electronic component body, and adhesive layers which adhere the electronic component body and the sealing members, respectively. Between the electronic component body and the sealing members, sealed spaces are formed, respectively. The adhesive layers each contain organic fillers and inorganic fillers. The organic fillers are in contact with both the electronic component body and the sealing members. The inorganic fillers each have a minimum particle diameter smaller than the thickness of each of the adhesive layers. When the adhesive layers are viewed in a thickness direction thereof, the inorganic fillers are provided between the organic fillers and the electronic component body and between the organic fillers and each of the sealing members.

20 Claims, 2 Drawing Sheets

(51) Int. Cl.
  H05K 1/02   (2006.01)
  H01L 23/02  (2006.01)
  B23B 37/00  (2006.01)
  H01L 23/29  (2006.01)
  H01L 21/56  (2006.01)
  H01L 23/31  (2006.01)
  H03H 9/10   (2006.01)

(56) References Cited

U.S. PATENT DOCUMENTS

| | | | |
|---|---|---|---|
| 2005/0088060 A1* | 4/2005 | Komuro et al. | 310/344 |
| 2008/0176167 A1 | 7/2008 | Kawamori et al. | |
| 2008/0231145 A1* | 9/2008 | Nagano et al. | 310/344 |
| 2009/0155608 A1* | 6/2009 | Nomura et al. | 428/457 |
| 2010/0025089 A1* | 2/2010 | Taketatsu et al. | 174/257 |
| 2010/0065311 A1* | 3/2010 | Tanaka et al. | 174/257 |
| 2010/0139947 A1* | 6/2010 | Kojima et al. | 174/126.1 |

FOREIGN PATENT DOCUMENTS

| | | |
|---|---|---|
| JP | 2003-142620 A | 5/2003 |
| JP | 2003-277711 A | 10/2003 |
| JP | 2004335872 A * | 11/2004 |
| JP | 2005-236212 A | 9/2005 |
| JP | 2009-141018 A | 6/2009 |
| JP | 2009-149829 A | 7/2009 |
| JP | 2009-203478 A | 9/2009 |
| JP | 2009-206136 A | 9/2009 |
| JP | 2010-010690 A | 1/2010 |

OTHER PUBLICATIONS

Japanese Office Action issued for JP 2011-545577, dispatch date Jul. 23, 2013 (with English translation).
PCT/JP2011/055791 Written Opinion dated May 23, 2011.

* cited by examiner

ELECTRONIC COMPONENT AND METHOD FOR MANUFACTURING THE SAME

CROSS REFERENCE TO RELATED APPLICATIONS

The present application is a continuation of International application No. PCT/JP2011/055791, filed Mar. 11, 2011, which claims priority to Japanese Patent Application No. 2010-085167, filed Apr. 1, 2010, the entire contents of each of which are incorporated herein by reference.

FIELD OF THE INVENTION

The present invention relates to an electronic component and a method for manufacturing the same. In particular, the present invention relates to an electronic component having a sealing structure and a method for manufacturing the electronic component.

BACKGROUND OF THE INVENTION

Heretofore, various electronic components, each of which requires a sealing structure, such as a piezoelectric vibration component including a piezoelectric vibration element, for example, have been used. In the electronic component having a sealing structure as described above, in general, a sealing member is adhered to an electronic component body with an adhesive.

The sealing member is generally formed of a material, such as a metal, having a low air permeability. However, the air permeability of the adhesive is relatively high. Accordingly, an internal gas may leak through an adhesive layer, or external air, moisture, and the like may flow into an airtight room through the adhesive layer. Hence, an adhesive having a low air permeability has been increasingly and strongly desired.

For example, the following Patent Literature 1 has disclosed as an adhesive composition used to seal an electronic component, an adhesive composition containing an epoxy resin, a curing agent, inorganic fillers, and a rubber component as essential components.

PTL 1: Japanese Unexamined Patent Application Publication No. 2003-277711

SUMMARY OF THE INVENTION

However, even if an adhesive composition containing inorganic fillers as disclosed in Patent Literature 1 described above was used, it was difficult to seal an electronic component with sufficiently high airtightness, and hence, a highly reliable electronic component was difficult to obtain.

The present invention was made in consideration of the points described above, and an object of the present invention is to provide an electronic component having a sealing structure excellent in reliability and a method for manufacturing the electronic component.

An electronic component according to the present invention includes an electronic component body, a sealing member, and an adhesive layer. The sealing member seals the electronic component body. The adhesive layer adheres between the electronic component body and the sealing member. A sealed space is formed between the electronic component body and the sealing member. The adhesive layer contains organic fillers and inorganic fillers. The organic fillers are in contact with both the electronic component body and the sealing member. The inorganic fillers each have a minimum particle diameter smaller than the thickness of the adhesive layer. When the adhesive layer is viewed in a thickness direction thereof, the inorganic fillers are provided between the organic fillers and the electronic component body and between the organic fillers and the sealing member.

In one specific aspect of the electronic component according to the present invention, the organic fillers are in contact by pressure with both the electronic component body and the sealing member. In this case, since the airtightness of the electronic component can be further improved, an electronic component having more excellent reliability can be obtained.

In another specific aspect of the electronic component according to the present invention, the ratio of the minimum particle diameter of each of the inorganic fillers to the thickness of the adhesive layer ((the minimum particle diameter of each of the inorganic fillers)/(the thickness of the adhesive layer)) is in a range of 0.004 to 0.6. According to this structure, the airtightness of the electronic component can be further improved. Therefore, an electronic component having more excellent reliability can be obtained. In addition, when the inorganic fillers each have a flat shape, "the minimum particle diameter of each of the inorganic fillers" is the thickness of each of the inorganic fillers.

In another specific aspect of the electronic component according to the present invention, the content of the organic fillers in the adhesive layer is in a range of 5 to 30 percent by mass. When the content of the organic fillers in the adhesive layer is too large, the adhesive strength may be excessively decreased in some cases. On the other hand, when the content of the organic fillers in the adhesive layer is too small, defective sealing may occur in some cases.

In still another specific aspect of the electronic component according to the present invention, the content of the inorganic fillers in the adhesive layer is in a range of 20 to 45 percent by mass. When the content of the inorganic fillers in the adhesive layer is too large, the adhesive strength may be excessively decreased in some cases. On the other hand, when the content of the inorganic fillers in the adhesive layer is too small, defective sealing may occur in some cases.

In still another specific aspect of the electronic component according to the present invention, the organic fillers include an elastomer. In this case, a leak path is more difficult to be formed between the organic fillers and the electronic component body and between the organic fillers and the sealing member. Hence, more excellent reliability can be realized.

In still another specific aspect of the electronic component according to the present invention, the organic fillers include a silicone rubber.

In still another specific aspect of the electronic component according to the present invention, the organic fillers include an acrylic resin composition, a vinyl chloride resin composition, or a polyamide.

In still another specific aspect of the electronic component according to the present invention, the inorganic fillers include alumina, silica, talc, calcium carbonate, or aluminum nitride.

In still another specific aspect of the electronic component according to the present invention, the adhesive layer is a cured product of a thermosetting resin containing the organic fillers and the inorganic fillers.

A method for manufacturing an electronic component according to the present invention relates to a method for manufacturing the electronic component according to the present invention. The method for manufacturing an electronic component according to the present invention includes a step of disposing an adhesive containing organic fillers and inorganic fillers between an electronic component body and a sealing member, and while a pressure is applied in a direction so that the electronic component body and the sealing member are moved toward each other, a curing step of forming an adhesive layer by heat curing of the adhesive.

In one specific aspect of the method for manufacturing an electronic component according to the present invention, in the curing step, when the adhesive is cured, the pressure is applied to the electronic component body and the sealing member so that the organic fillers are deformed by being pressed with the electronic component body and the sealing member.

In the present invention, the organic fillers are in contact with both the electronic component body and the sealing member. In addition, when the adhesive layer is viewed in a thickness direction thereof, the inorganic fillers are provided between the organic fillers and the electronic component body and between the organic fillers and the sealing member. Accordingly, excellent reliability can be realized.

DETAILED DESCRIPTION OF THE PREFERRED EMBODIMENTS

Hereinafter, a preferable embodiment of the present invention will be described using an electronic component 1 shown in FIG. 1 by way of example. However, the electronic component 1 is merely an example. The present invention is not limited to the electronic component 1 at all.

Figure 1:
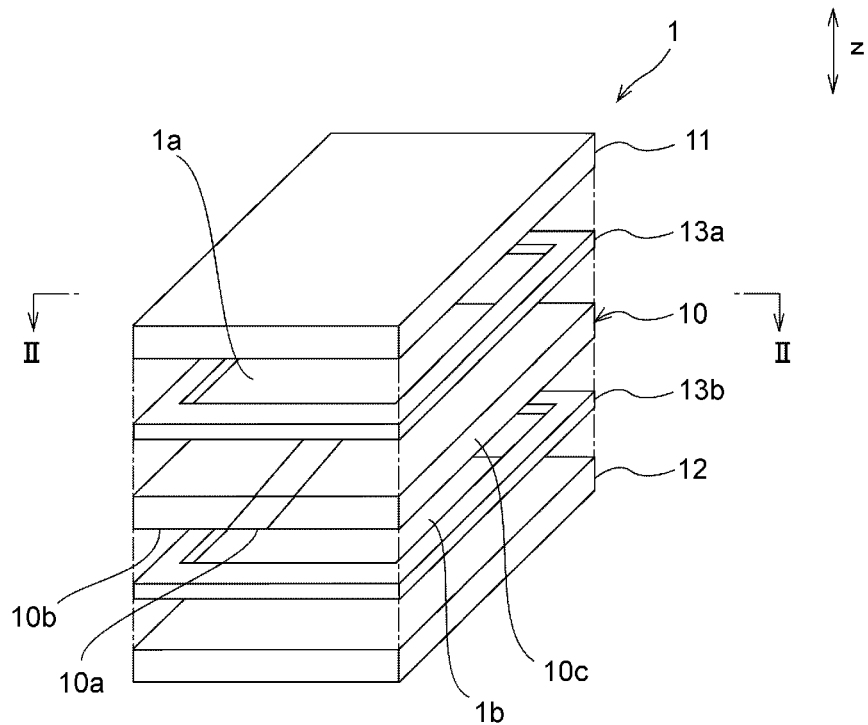
FIG. 1 is a schematic exploded perspective view of an electronic component according to one embodiment of the present invention.
Figure 2:
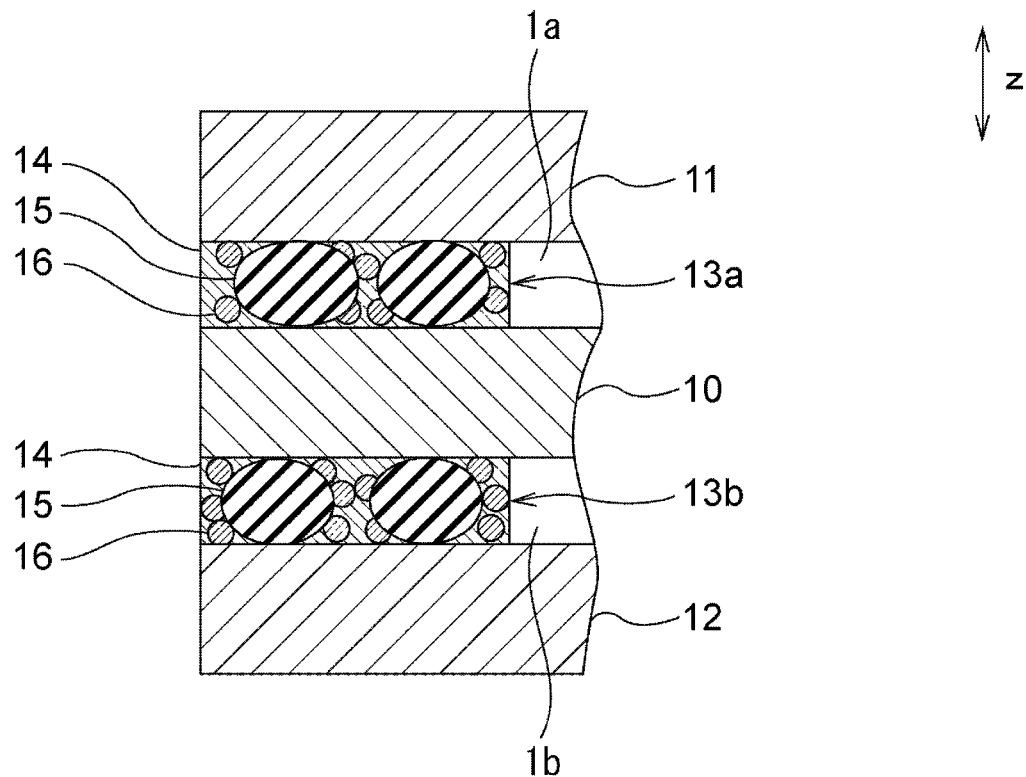
FIG. 2 is a schematic cross-sectional view taken along the line II-II of FIG. 1.

FIG. 1 is a schematic exploded perspective view of an electronic component according to this embodiment. FIG. 2 is a schematic cross-sectional view taken along the line II-II of FIG. 1.

As shown in FIG. 1, the electronic component 1 has an electronic component body 10. In this embodiment, the electronic component body 10 includes a piezoelectric vibrator 10a and holding members 10b and 10c holding the piezoelectric vibrator 10a. However, the type of electronic component body 10 and the shape dimension thereof are not particularly limited as long as an airtight space is required. The electronic component body 10 may be a body having, for example, a surface acoustic wave element and/or an MEMS (Micro Electro Mechanical Systems) element.

In this embodiment, although the electronic component body 10 is formed to have a plate shape, the shape of the electronic component body 10 is not limited to a plate shape.

The electronic component 1 includes sealing members 11 and 12 which seal the electronic component body 10. Sealed spaces 1a and 1b are formed by the electronic component body 10 and the sealing members 11 and 12, respectively.

The sealing members 11 and 12 are each preferably formed of a material having a low air permeability. The sealing members 11 and 12 can be formed, for example, from a metal, a ceramic, and/or a resin.

The sealing members 11 and 12 are adhered to the electronic component body 10 with adhesive layers 13a and 13b, respectively. The adhesive layers 13a and 13b are layers each formed by curing a resin adhesive, such as a thermosetting resin adhesive, containing organic fillers 15 and inorganic fillers 16 shown in FIG. 2. Accordingly, the adhesive layers 13a and 13b are each formed of a cured resin adhesive 14 containing the organic fillers 15 and the inorganic fillers 16. In more particular, in this embodiment, the adhesive layers 13a and 13b are each formed of a cured thermosetting resin adhesive 14 containing the organic fillers 15 and the inorganic fillers 16.

The organic fillers 15 are preferably formed of an elastomer having elasticity. In particular, the organic fillers 15 are preferably formed of a material, such as a silicone rubber, having elasticity.

In addition, the organic fillers 15 may also be formed, for example, of an acrylic resin composition, a vinyl chloride resin composition, or a polyamide. The organic fillers 15 are in contact with both the electronic component body 10 and the sealing members 11 and 12. In particular, the organic fillers 15 are in contact by pressure with both the electronic component body 10 and the sealing members 11 and 12.

The inorganic fillers 16 each have a minimum particle diameter smaller than the thickness of each of the adhesive layers 13a and 13b. When the adhesive layers 13a and 13b are viewed in a thickness direction z thereof, some of the inorganic fillers 16 are provided between the organic fillers 15 and the electronic component body 10 and between the organic fillers 15 and each of the sealing members 11 and 12.

The shape of each of the inorganic fillers 16 is not particularly limited. In this embodiment, in particular, the shape of each of the inorganic fillers 16 is approximately spherical.

Next, a method for manufacturing the electronic component 1 according to this embodiment will be described.

Briefly speaking, the electronic component 1 can be manufactured in such a way that after adhesives each containing the organic fillers 15 and the inorganic fillers 16 are disposed between the electronic component body 10 and the sealing members 11 and 12, the adhesives are cured by applying a pressure in a direction so that the electronic component body 10 and each of the sealing members 11 and 12 are moved toward each other.

Hereinafter, one example of the method for manufacturing the electronic component 1 will be described in detail.

First, the electronic component body 10 and the sealing members 11 and 12 are prepared. Next, the adhesives each containing the organic fillers 15 and the inorganic fillers 16 are applied to the electronic component body 10 or the sealing members 11 and 12. The application of the adhesive can be performed by various printing methods, such as a screen printing method and an ink jet printing method.

Next, the electronic component body 10 or the sealing members 11 and 12, to which the adhesives are not applied, are preheated. A preheat temperature may be set, for example, to approximately 50° C. to 100° C.

Next, in the state in which the electronic component body 10 is disposed to face the sealing members 11 and 12 with the adhesives provided therebetween, and a pressure is applied in a direction so that the electronic component body 10 and each of the sealing members 11 and 12 are moved toward each other, the adhesives are cured by heating to form the adhesive layers 13a and 13b, so that the electronic component 1 can be completed.

In addition, the pressure is preferably applied to the electronic component body 10 and the sealing members 11 and 12 so that the organic fillers 15 may be deformed by being pressed with the electronic component body 10 and the sealing members 11 and 12.

In this embodiment, the maximum particle diameter of each of the organic fillers 15 contained in the thermosetting adhesive before curing is larger than the thickness of each of the adhesive layers 13a and 13b of the electronic component 1. When the condition described above is satisfied, the shape of each of the organic fillers 15 is not particularly limited. The organic fillers 15 each may have, for example, a spherical or a flat shape.

Figure 3:
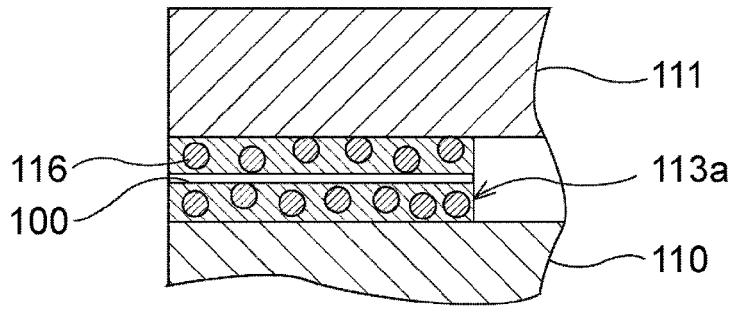
FIG. 3 is a partially schematic cross-sectional view of an electronic component according to a reference example.

Incidentally, as shown in FIG. 3, for example, in the case in which an electronic component body 110 and a sealing member 111 are adhered to each other using a thermosetting resin adhesive containing only inorganic fillers 116, when the adhesive is heat-cured, air present in a space formed between the electronic component body 110 and the sealing member 111 is also heated and is thermally expanded. This air thus thermally expanded flows out through an uncured adhesive. Hence, for example, a through-hole 100 called a leak path may be unfavorably formed in a formed adhesive layer 113a in some cases. Accordingly, since moisture, air, corrosive gas, and the like are able to enter an internal space of the electronic component 1 through this through-hole 100, the airtightness of the electronic component is degraded, and the reliability thereof may be degraded in some cases.

On the other hand, in this embodiment, the organic fillers 15 are contained in the adhesive layers 13a and 13b together with the inorganic fillers 16 as described above. In addition, while a pressure is applied in a direction so that the electronic component body 10 and each of the sealing members 11 and 12 are moved toward each other, the adhesives are cured so that the organic fillers 15 are in contact with both the electronic component body 10 and the sealing members 11 and 12. In addition, when the adhesive layers 13a and 13b are viewed in a thickness direction z thereof, the inorganic fillers 16 are provided between the organic fillers 15 and the electronic component body 10 and between the organic fillers 15 and each of the sealing members 11 and 12.

Accordingly, even if a gas tends to pass through each of the adhesive layers 13a and 13b, the gas is blocked by the organic fillers 15 and the inorganic fillers 16, and the leak path cannot be easily formed. Therefore, in this embodiment, an electronic component 1 having excellent reliability can be obtained. In addition, in this embodiment, since the leak path cannot be easily formed, it is not necessary to perform a step of sorting electronic components in each of which the leak path is formed.

In particular, in this embodiment, the organic fillers 15 are in contact by pressure with both the electronic component body 10 and the sealing members 11 and 12. Accordingly, more excellent reliability can be realized. Furthermore, when the organic fillers 15 are each formed of an elastomer having elasticity, the leak path is more difficult to be formed between the organic fillers 15 and the electronic component body 10 and between the organic fillers 15 and each of the sealing members 11 and 12. Hence, even more excellent reliability can be realized.

When an adhesive is used which contains only organic fillers having a shape dimension to be in contact with both the electronic component body and the sealing members, the leak path is liable to be formed in a space formed between the organic fillers and the electronic component body and/or between the organic fillers and each of the sealing members. Accordingly, it is difficult to realize sufficiently excellent reliability.

In addition, since inorganic fillers each having a relatively small minimum particle diameter also have a function to increase the viscosity of an adhesive, when the inorganic fillers as described above are contained, the viscosity of the adhesive can be increased to a level at which the leak path is difficult to be formed. That is, when the inorganic fillers are not contained in the adhesive, the viscosity of the adhesive is excessively decreased, and as a result, the leak path is liable to be formed. When the inorganic fillers are contained in the adhesive together with the organic fillers, the viscosity of the adhesive can be effectively increased, and the leak path is effectively suppressed from being formed in the space between the organic fillers and the electronic component body and/or between the organic fillers and each of the sealing members.

Furthermore, in order to realize more excellent reliability, the ratio of the minimum particle diameter of each of the inorganic fillers 16 to the thickness of each of the adhesive layers 13a and 13b ((the minimum particle diameter of each of the inorganic fillers 16)/(the thickness of each of the adhesive layers 13a and 13b)) is preferably in a range of 0.004 to 0.6. When (the minimum particle diameter of each of the inorganic fillers 16)/(the thickness of each of the adhesive layers 13a and 13b) is excessively large, the leak path may be formed in some cases. When (the minimum particle diameter of each of the inorganic fillers 16)/(the thickness of each of the adhesive layers 13a and 13b) is excessively small, the leak path may be formed in some cases.

The content of the organic fillers 15 in each of the adhesive layers 13a and 13b is preferably, for example, in a range of 5 to 30 percent by mass. If the content of the organic fillers 15 in each of the adhesive layers 13a and 13b is excessively large, the adhesive strength may be decreased in some cases. On the other hand, if the content of the organic fillers 15 in each of the adhesive layers 13a and 13b is excessively small, the leak path may be formed in some cases.

The content of the inorganic fillers 16 in each of the adhesive layers 13a and 13b is preferably in a range of 20 to 45 percent by mass. If the content of the inorganic fillers 16 in each of the adhesive layers 13a and 13b is excessively large, the adhesive strength may be decreased in some cases. On the other hand, if the content of the inorganic fillers 16 in each of the adhesive layers 13a and 13b is excessively small, the leak path may be formed in some cases.

Example 1

In this example, the electronic component 1 according to the above embodiment was formed in the following way. In particular, first, the adhesives were applied to the sealing members 11 and 12 by a screen printing method. The adhesive used in this case was formed of a thermosetting epoxy resin containing organic fillers 15 of a cross-linked acrylic resin, and inorganic fillers 16 including inorganic fillers of silica each having a flat shape and inorganic fillers of alumina. The mean particle diameter of the organic fillers 15 was 20 μm. The minimum thickness of the inorganic fillers was 3 μm, and the maximum length thereof in plan view was 14 μm. The mean particle diameter of the inorganic fillers of alumina was 0.1 μm. The content of the organic fillers 15 in the adhesive was 12.5 percent by mass. The content of the inorganic fillers of silica in the adhesive was 5 percent by mass. The content of the inorganic fillers of alumina was 25 percent by mass.

Next, the electronic component body 10 was repetitive preheated to 75° C.±10° C. Subsequently, the electronic component body 10 was adhered to the sealing members 11 and 12, and a pressure of 90±5 kgf was applied thereto. In the state described above, the adhesives were cured by heating to 120° C.±5° C. to form the adhesive layers 13a and 13b, so that the electronic component 1 was completed.

In addition, the thickness of each of the adhesive layers 13a and 13b was 7 μm.

Figure 4:
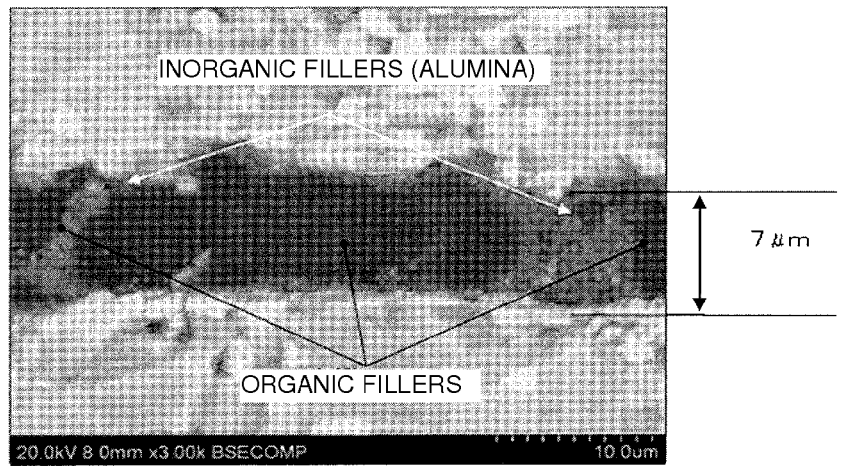
FIG. 4 is an enlarged cross-sectional photograph of an electronic component of Example 1.

A cross-sectional photograph of the electronic component thus formed is shown in FIG. 4. As shown in FIG. 4, it is found that the organic fillers 15 are in contact with both the electronic component body 10 and the sealing members 11 and 12. In addition, it is found that the inorganic fillers 16 of alumina are provided in gaps located between the organic fillers 15 and the electronic component body 10 and between the organic fillers 15 and each of the sealing members 11 and 12.

Comparative Example 1

An electronic component was formed in a manner similar to that in Example 1 except that adhesives, each of which had a composition similar to that described above but included no organic fillers 15, were used.

Comparative Example 2

Formation of an electronic component was tried in a manner similar to that of Example 1 except that adhesives, each of which contained no inorganic fillers but only the organic fillers 15, were used. However, since having an excessively low viscosity, the adhesives each containing no inorganic fillers could not be preferably applied, and the electronic component body and each of the sealing members could not be preferably adhered to each other.

(Evaluation)

A leak inspection of the electronic component formed in each of Example 1 and Comparative Example 1 was performed. In particular, the leak inspection was performed in such a way that after the electronic component was immersed in an inert solution at 125° C.±5° C., visual inspection was performed whether air bubbles were generated from the electronic component or not. As a result, the generation of air bubbles from the electronic component formed in Example 1 was not observed. On the other hand, from the electronic component formed in Comparative Example 1, air bubbles were generated.

Figure 5:
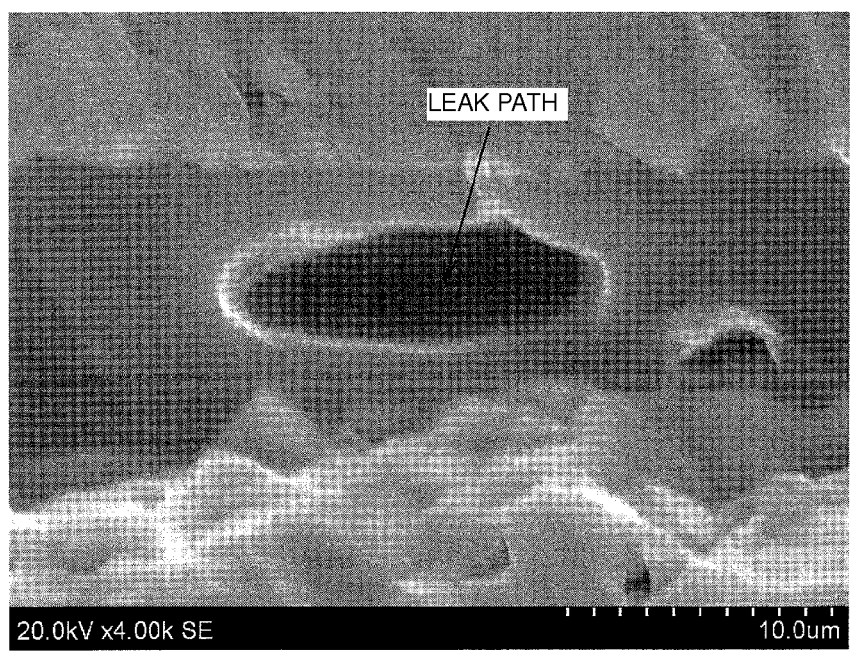
FIG. 5 is an enlarged cross-sectional photograph of an electronic component of Comparative Example 1.

In addition, it is found that also from cross-sectional photographs shown in FIGS. 4 and 5, although no leak path is formed in the electronic component 1 of Example 1, a leak path is formed in the electronic component of Comparative Example 1.

From the results described above, it is found that when an electronic component body and each sealing member are adhered to each other with an adhesive containing organic fillers and inorganic fillers, each type of fillers having a size according to the present invention, the generation of the leak path can be suppressed, and an electronic component having excellent reliability can be obtained.

Examples 2 to 4

Except that particles of an acrylic resin having a mean particle diameter of 20 μm were used as the organic fillers, alumina particles having a mean particle diameter of 0.1 μm were used as the inorganic fillers, and the contents of the organic fillers and that of the inorganic fillers in the adhesive were set as shown in the following Table 1, 200 electronic components were formed in a manner similar to that of Example 1. By a method similar to the above inspection method, a leak test was performed on the 200 electronic components thus formed. The results are shown in the following Table 1.

TABLE 1

|  | EXAMPLE 2 | EXAMPLE 3 | EXAMPLE 4 |
| --- | --- | --- | --- |
| CONTENT OF ORGANIC FILLERS (PERCENT BY MASS) | 5 | 10 | 30 |
| CONTENT OF INORGANIC FILLERS (PERCENT BY MASS) | 30 | 30 | 30 |
| LEAKAGE DEFECT RATE (%) | 0 | 0 | 0 |

From the results shown in Table 1, it is found that in Examples 2 to 4 in which the content of the inorganic fillers in the adhesive is in a range of 5 to 30 percent by mass, a leakage defect was not generated.

Examples 5 to 8

Except that particles of an acrylic resin having a mean particle diameter of 20 μm were used as the organic fillers, alumina particles having a mean particle diameter of 0.1 μm were used as the inorganic fillers, and the contents of the organic fillers and that of the inorganic fillers in the adhesive were set as shown in the following Table 2, 200 electronic components were formed in a manner similar to that of Example 1. By a method similar to the above inspection method, a leak test was performed on the 200 electronic components thus formed. The results are shown in the following Table 2.

TABLE 2

|  | EXAMPLE 5 | EXAMPLE 6 | EXAMPLE 7 | EXAMPLE 8 |
| --- | --- | --- | --- | --- |
| CONTENT OF ORGANIC FILLERS (PERCENT BY MASS) | 10 | 20 | 35 | 45 |
| CONTENT OF INORGANIC FILLERS (PERCENT BY MASS) | 10 | 10 | 10 | 10 |
| LEAKAGE DEFECT RATE (%) | 1 | 0 | 0 | 0 |

As apparent from the results shown in Table 2, in Example 5 in which the content of the organic fillers was 10 percent by mass, the leakage defect rate was 1%, and on the other hand, in Examples 6 to 8 in which the content of the organic fillers was in a range of 20 to 45 percent by mass, the leakage defect rate was 0%. From those results, it is found that the content of the organic fillers in the adhesive is more preferably in a range of 20 to 45 percent by mass.

REFERENCE SIGNS LIST 1 electronic component
1a, 1b sealed space
10 electronic component body
10a piezoelectric vibrator
10b, 10c holding member
11, 12 sealing member
13a, 13b adhesive layer 14 cured resin adhesive
15 organic fillers
16 inorganic fillers

The invention claimed is:

1. An electronic component comprising:
an electronic component body;
a sealing member sealing the electronic component body; and
an adhesive layer between the electronic component body and the sealing member,
wherein a sealed space is located between the electronic component body and the sealing member,
the adhesive layer contains organic fillers in contact with both the electronic component body and the sealing member and inorganic fillers, the inorganic fillers each having a minimum particle diameter smaller than a thickness of the adhesive layer such that, when the adhesive layer is viewed in a thickness direction thereof, the inorganic fillers are positioned between the organic fillers and the electronic component body and between the organic fillers and the sealing member.

2. The electronic component according to claim 1, wherein the organic fillers are in contact with both the electronic component body and the sealing member.

3. The electronic component according to claim 1, wherein a ratio of the minimum particle diameter of each of the inorganic fillers to the thickness of the adhesive layer is in a range of 0.004 to 0.6.

4. The electronic component according to claim 1, wherein a content of the organic fillers in the adhesive layer is in a range of 5 to 30 percent by mass.

5. The electronic component according to claim 4, wherein a content of the inorganic fillers in the adhesive layer is in a range of 20 to 45 percent by mass.

6. The electronic component according to claim 1, wherein a content of the inorganic fillers in the adhesive layer is in a range of 20 to 45 percent by mass.

7. The electronic component according to claim 1, wherein the organic fillers include an elastomer.

8. The electronic component according to claim 7, wherein the elastomer is a silicone rubber.

9. The electronic component according to claim 1, wherein the organic fillers include an acrylic resin composition, a vinyl chloride resin composition, or a polyamide.

10. The electronic component according to claim 9, wherein the inorganic fillers include alumina, silica, talc, calcium carbonate, or aluminum nitride.

11. The electronic component according to claim 1, wherein the inorganic fillers include alumina, silica, talc, calcium carbonate, or aluminum nitride.

12. The electronic component according to claim 1, wherein the adhesive layer is a cured product of a thermosetting resin containing the organic fillers and the inorganic fillers.

13. A method for manufacturing an electronic component, the method comprising:
disposing an adhesive containing organic fillers and inorganic fillers between an electronic component body and a sealing member; and
curing the adhesive layer while a pressure is applied in a direction so that the electronic component body and the sealing member are moved toward each other, wherein
the inorganic fillers each have a minimum particle diameter smaller than a thickness of the adhesive layer such that, when the cured adhesive layer is viewed in a thickness direction thereof, the inorganic fillers are positioned between the organic fillers and the electronic component body and between the organic fillers and the sealing member.

14. The method for manufacturing the electronic component according to claim 13, wherein the adhesive is cured by application of heat.

15. The method for manufacturing the electronic component according to claim 13, wherein when the adhesive is cured in the curing step, the pressure is applied to the electronic component body and the sealing member so that the organic fillers are deformed by being pressed with the electronic component body and the sealing member.

16. The method for manufacturing the electronic component according to claim 13, wherein a ratio of the minimum particle diameter of each of the inorganic fillers to the thickness of the adhesive layer is in a range of 0.004 to 0.6.

17. The method for manufacturing the electronic component according to claim 13, wherein a content of the organic fillers in the adhesive layer is in a range of 5 to 30 percent by mass.

18. The method for manufacturing the electronic component according to claim 13, wherein a content of the inorganic fillers in the adhesive layer is in a range of 20 to 45 percent by mass.

19. The method for manufacturing the electronic component according to claim 13, wherein the organic fillers include an acrylic resin composition, a vinyl chloride resin composition, or a polyamide.

20. The method for manufacturing the electronic component according to claim 13, wherein the inorganic fillers include alumina, silica, talc, calcium carbonate, or aluminum nitride.

* * * * *